(12) United States Patent  
Kataoka (10) Patent No.: US 10,151,443 B2  
(45) Date of Patent: Dec. 11, 2018

(54) LED MODULE AND LIGHT FIXTURE WITH THE SAME

(71) Applicant: Panasonic Intellectual Property Management Co., Ltd., Osaka-shi, Osaka (JP)

(72) Inventor: Takaaki Kataoka, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 161 days.

(21) Appl. No.: 15/232,185

(22) Filed: Aug. 9, 2016

(65) Prior Publication Data

US 2017/0059097 A1    Mar. 2, 2017

(30) Foreign Application Priority Data

Aug. 31, 2015 (JP) ................. 2015-170735

(51) Int. Cl.
| | |
|---|---|
| *F21V 9/30* | (2018.01) |
| *F21V 5/00* | (2018.01) |
| *F21K 9/69* | (2016.01) |
| *H05K 1/18* | (2006.01) |
| *F21Y 105/10* | (2016.01) |
| *F21Y 115/10* | (2016.01) |

(52) U.S. Cl.
CPC ............. *F21V 5/007* (2013.01); *F21K 9/69* (2016.08); *F21Y 2105/10* (2016.08); *F21Y 2115/10* (2016.08); *H05K 1/181* (2013.01); *H05K 2201/09418* (2013.01); *H05K 2201/10106* (2013.01)

(58) Field of Classification Search
CPC .... F21K 9/64; F21K 9/69; F21S 2/005; F21V 15/007
See application file for complete search history.

(56) References Cited

U.S. PATENT DOCUMENTS

| | | | |
|---|---|---|---|
| 2005/0052378 A1 | 3/2005 | Hacker | |
| 2012/0146066 A1* | 6/2012 | Tischler | ............... H01L 27/156 257/89 |
| 2014/0009695 A1* | 1/2014 | Kuromizu | ......... G02F 1/133603 348/790 |
| 2015/0115304 A1* | 4/2015 | Singer | ...................... F21V 9/30 257/98 |

FOREIGN PATENT DOCUMENTS

| | | |
|---|---|---|
| JP | 2005-057272 A | 3/2005 |
| JP | 2009-231027 A | 10/2009 |
| JP | 2013-020712 A | 1/2013 |
| JP | 2013-191685 A | 9/2013 |
| JP | 2015-061067 A | 3/2015 |

* cited by examiner

*Primary Examiner* — Anabel Ton  
(74) *Attorney, Agent, or Firm* — McDermott Will & Emery LLP (57) ABSTRACT

An LED module includes light sources that are disposed on a surface of a circuit substrate and each of which has LED chips and a wavelength conversion member covering the LED chips. The light sources include first light sources and second light sources. LED chips in each of the first light sources differ in number from LED chips in each of the second light sources. The circuit substrate includes a conductive pattern that is connected with the first and second light sources, and that forms each of one or more series circuits along with at least one of the first light sources and at least one of the second light sources.

18 Claims, 6 Drawing Sheets

LED MODULE AND LIGHT FIXTURE WITH THE SAME

CROSS REFERENCE TO RELATED APPLICATIONS

This application claims the benefit and priority of Japanese Patent Application No. 2015-170735, filed on Aug. 31, 2015, the entire contents of which are incorporated herein by reference.

TECHNICAL FIELD

The disclosure relates to an LED (Light Emitting Diode) module and a light fixture with the same.

BACKGROUND ART

There has been proposed a conventional LED module formed of two LED packages that respectively have higher and lower rated outputs and are mounted on an identical LED module substrate (JP 2013-20712 A (hereinafter referred to as "Document 1")). Document 1 also describes a light fixture with the above LED module.

An LED module and a light fixture with it, which are capable of improving a feeling of brightness of a space to be illuminated may be desired in the field of LED modules and light fixtures therewith.

SUMMARY

It is an object of the present disclosure to provide an LED module and a light fixture therewith that are capable of improving a feeling of brightness of a space to be illuminated.

An LED module according to an aspect includes a circuit substrate and light sources. The light sources are disposed on a surface of the circuit substrate. Each of the light sources has LED chips and a wavelength conversion member covering the LED chips. The light sources include first light sources and second light sources. LED chips in each of the first light sources differ in number from LED chips in each of the second light sources. The circuit substrate includes a conductive pattern that is connected with the first and second light sources. The conductive pattern forms each of one or more series circuits along with at least one of the first light sources and at least one of the second light sources.

A light fixture according to an aspect includes the aforementioned LED module, and a fixture body that retains the LED module.

BRIEF DESCRIPTION OF THE DRAWINGS

The figures depict one or more implementations in accordance with the present teaching, by way of example only, not by way of limitations. In the figure, like reference numerals refer to the same or similar elements where.

DETAILED DESCRIPTION (Embodiment 1)

An LED module 1a in the embodiment will be hereinafter explained with reference to FIGS. 1A, 1B, 1C, 2, 3A and 3B. Each of FIGS. 1A, 1B, 3A and 3B is a schematic diagram, and does not necessarily show that dimensional ratios of components therein correspond to actual dimensional ratios.

Figure 1A:
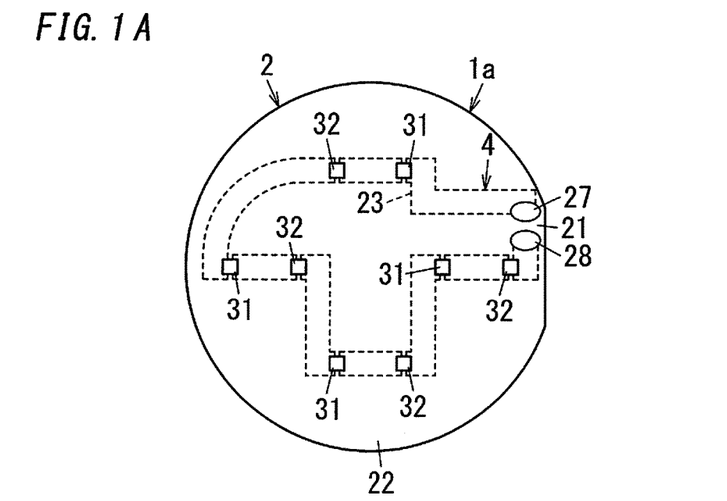
FIG. 1A is a schematic plan view of an LED module in accordance with Embodiment 1.
Figure 1B:
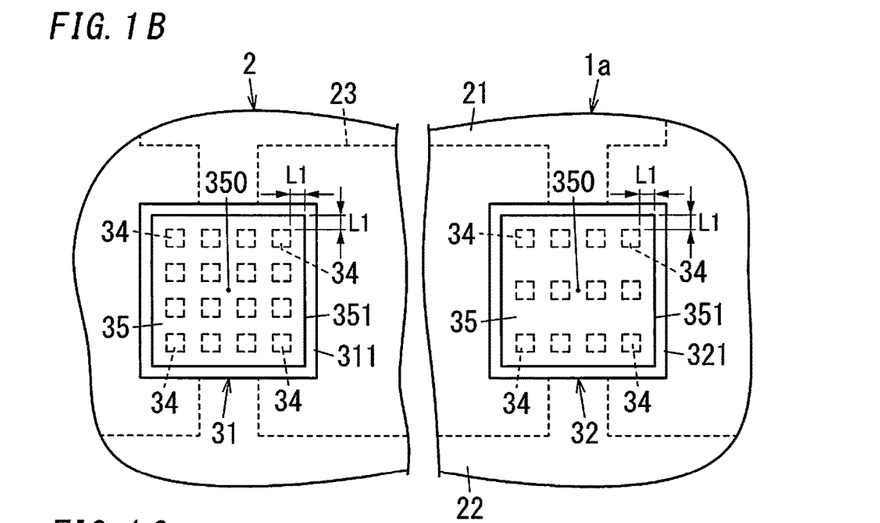
FIG. 1B is an enlarged plan view of part of the LED module.

The LED module 1a includes a circuit substrate 2 and light sources (see 31 and 32 in FIG. 1A). The light sources are disposed on a surface 21 of the circuit substrate 2. Each of the light sources includes LED (Light Emitting Diode) chips 34 and a wavelength conversion member 35 covering the LED chips 34 (see FIG. 1B). The light sources includes first light sources 31 (four sources in the example of FIG. 1A) and second light sources 32 (four sources in FIG. 1A). LED chips 34 in each of the first light sources 31 differ in number from LED chips 34 in each of the second light sources 32. The circuit substrate 2 includes a conductive pattern (a conductive layer that includes electric conductors and forms a pattern) 23 that is connected with the first light sources 31 and the second light sources 32. The conductive pattern 23 forms each of one or more series circuits 4 along with at least one of the first light sources 31 and at least one of the second light sources 32. In an example (see FIG. 1A), the conductive pattern 23 forms one series circuit 4 along with all of the first light sources 31 and all of the second light sources 32. In another example (see FIG. 7 to be explained later), the conductive pattern 23 forms each of two series circuits 4 along with half of the first light sources 31 and half of the second light sources 32.

With the above configuration, the LED module 1a can improve a feeling of brightness of a space. In the LED module 1a, the first light sources 31 are different in luminous flux from the second light sources 32. The LED module 1a can accordingly have luminance distribution including high luminance and low luminance, thereby improving the feeling of brightness. In comparison with the case where the first light sources 31 are connected in parallel with the second light sources 32, the LED module 1a can prevent reduction in a luminance ratio of the first light sources 31 to the second light sources 32, caused by dispersion in electrical currents through the first and second light sources 31 and 32 by dispersion in electrical properties of the first and second light sources 31 and 32. The space is, for example an indoor or outdoor space. In the embodiment, the feeling of brightness of the space is an amount that a person feels through the mind when observing the space.

Components of the LED module 1a will be hereinafter explained in more detail.

As stated above, the LED module 1a includes the circuit substrate 2, the first light sources 31 and the second light sources 32.

The circuit substrate 2 is shaped like a circle in planar view, but is not limited to this. The planar view of the circuit substrate 2 is a peripheral shape of the circuit substrate 2 seen along a thickness direction of the circuit substrate 2. The circuit substrate 2 is formed of, for example a printed-circuit board. Preferably, the printed-circuit board has high thermal conductivity. For example, the printed-circuit board is formed of a glass fabric/glass nonwoven fabric base material epoxy resin copper clad laminate in conformity with the CEM-3 (Composite Epoxy Materials-3) standard.

Preferably, the circuit substrate 2 includes a white resist layer 22 configured to reflect respective light from the first and second light sources 31 and 32. In case the circuit substrate 2 includes the white resist layer 22, a surface of the white resist layer 22 of the circuit substrate 2 forms part of the surface 21 of the circuit substrate 2. The LED module 1a can accordingly suppress optical absorption in the circuit substrate 2 and increase the optical output thereof. Preferably, material of the white resist layer 22 is selected from the group consisting of a white resist of fluorine resin, a white resist of epoxy resin and a white resist of silicone resin, for example.

Figure 1C:
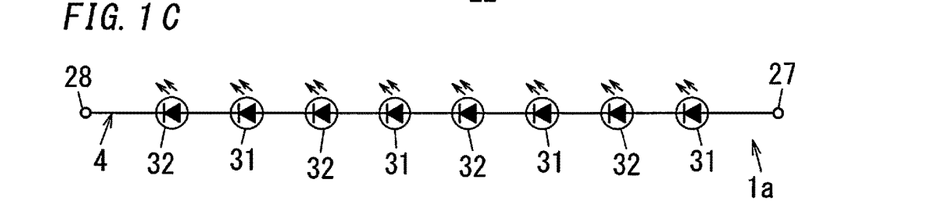
FIG. 1C is a schematic circuit diagram of the LED module.

In the LED module 1a of the embodiment, the first light sources 31 (four sources in FIG. 1A) and the second light sources 32 (four sources in FIG. 1A) are disposed on the surface 21 of the circuit substrate 2. As shown in FIG. 1C, the LED module 1a includes the first and second light sources 31 and 32 connected in series as the electrical connection configuration between the first light sources 31 and the second light sources 32. In the example of FIG. 1C, each of the first and second light sources 31 and 32 is depicted by the electronic symbol of LED. The circuit substrate 2 includes the above conductive pattern 23 in order to form the series circuit 4 in which the first and second light sources 31 and 32 are connected in series. The circuit substrate 2 includes the conductive pattern 23, a pattern of which is designed to provide the connection relation between the first light sources 31 and the second light sources 32. The conductive pattern 23 is formed of, for example an electrically conductive layer. The electrically conductive layer is formed of, for example copper foil or the like. The circuit substrate 2 also includes first and second terminals 27 and 28 for power supply to the series circuit 4. Each of the first and second terminals 27 and 28 is formed of, for example the electrically conductive layer like the conductive pattern 23. The LED module 1a is configured to allow the first and second light sources 31 and 32 to emit light by electricity supplied between the first and second terminals 27 and 28 from, e.g. an external power unit (power supply) or the like.

In the embodiment, each of the first and second light sources 31 and 32 is shaped like a rectangle (a right-angled quadrilateral) in planar view. Specifically, each of the first and second light sources 31 and 32 is shaped like a square in planar view. A planar view of each of the first light sources 31 is its own peripheral shape seen along the thickness direction of the circuit substrate 2. A planar view of each of the second light sources 32 is its own peripheral shape seen along the thickness direction of the circuit substrate 2.

Preferably, light source color of each of the first and second light sources 31 and 32 is set based on correlated color temperature as LED light source color defined by, for example JIS Z9112:2012. In JIS Z9112:2012, LED light source color is classified into five types of daylight (D) color, neutral white (N) color, white (W) color, warm white (WW) color and light bulb (L) color (Incandescent color) based on XYZ color space chromaticity. In the LED module 1a, light source color of each of the first and second light sources 31 and 32 is white color, but not limited to this. Each light source color may be neutral white color or the like.

Preferably, each LED chip 34 is shaped like, for example a square in planar view. A planar view of each LED chip 34 is its own peripheral shape seen along the thickness direction of the circuit substrate 2.

In an example, each LED chip 34 is an LED chip configured to emit blue light. Blue light to be emitted from each LED chip 34 has emission spectrum, a peak wavelength of which is contained in the wavelength region of 440 nm to 480 nm. Each wavelength conversion member 35 contains phosphor particles that are excited by light (first light) from a corresponding chip 34 to emit light (second light) containing a wavelength longer than that of the first light, for example. It is preferable that each wavelength conversion member 35 be formed of, for example a mixture of phosphor particles and optically-transparent material. Preferably, the optically-transparent material is material with high transmittance with respect to visible light. The optically-transparent material is silicone resin, for example. It is accordingly possible to improve heat resistance and weather resistance of each wavelength conversion member 35 in the LED module 1a. For example, the silicone resin means not only silicone resin but also silicone-modified resin or the like. Each wavelength conversion member 35 includes the above phosphor particles as wavelength conversion material for wavelength converting part of first light from a corresponding LED chip 34 to emit light containing a wavelength different from that of the first light. As an example, the phosphor particles are yellow phosphor particles for emitting yellow light. Preferably, light (fluorescence) from the yellow phosphor particles has emission spectrum, a main peak wavelength of which is contained in the wavelength region of, for example 530 nm to 580 nm. Composition examples of the yellow phosphor particles include $SrSi_2O_2N_2$ activated by Eu and the like.

Figure 2:
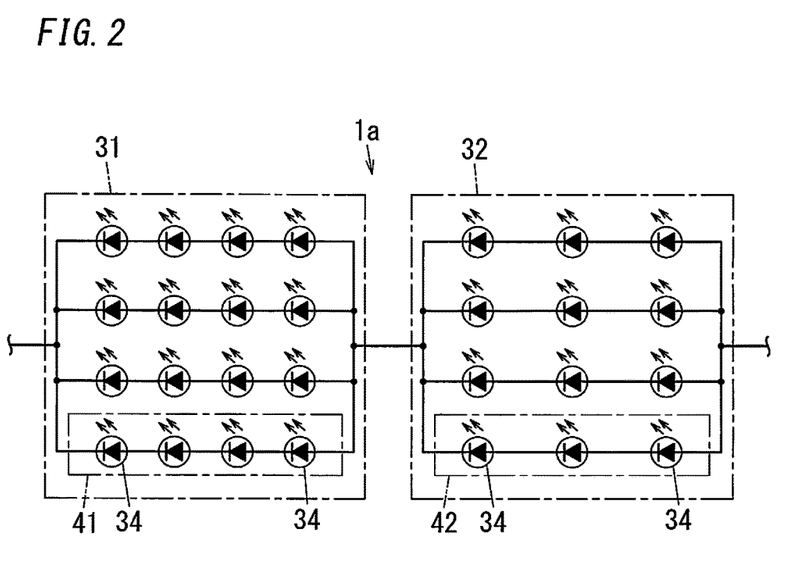
FIG. 2 is a circuit diagram of the LED module.
Figure 3A:
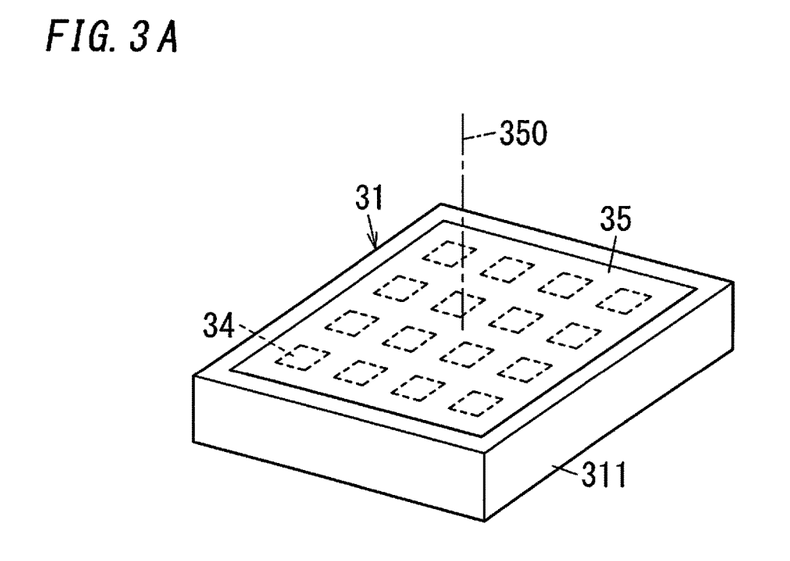
FIG. 3A is a schematic perspective view of a surface-mount LED forming a first light source in the LED module.
Figure 3B:
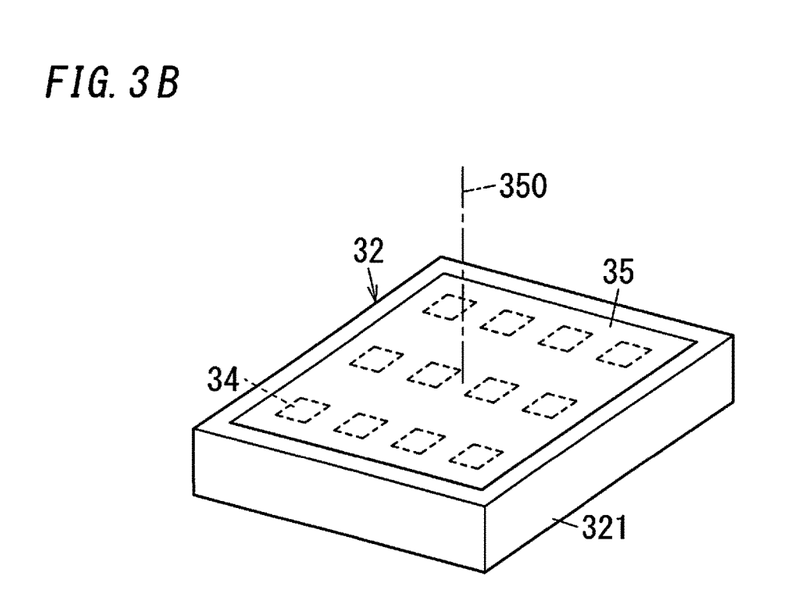
FIG. 3B is a schematic perspective view of a surface-mount LED forming a second light source in the LED module.

Preferably, each first light source 31 includes LED chips 34 with identical specifications. The identical specifications mean having an identical emission peak wavelength, an identical structure, an identical forward voltage (Vf) and an identical luminous flux. As shown in FIG. 2, each first light source 31 includes LED chips 34 (sixteen chips in the illustrated figure) connected in series and parallel. Each second light source 32 includes LED chips 34 (twelve chips in the illustrated figure) connected in series and parallel. Preferably, each second light source 32 includes LED chips 34 with identical specifications. In addition, it is preferable that LED chips 34 of each second light source 32 have the same specifications as LED chips 34 of each first light source 31.

In the embodiment, LED chips 34 (sixteen chips in FIG. 2) in each of the first light sources 31 form a first prescribed number of (four in the illustrated figure) first segmental circuits 41 that are connected in parallel. Each of the first segmental circuits 41 includes a first specific number of (four in the illustrated figure) LED chips 34 that are connected in series. LED chips 34 (twelve chips in FIG. 2) in each of the second light sources 32 form a second prescribed number of (four in the illustrated figure) second segmental circuits 42 that are connected in parallel. Each of the second segmental circuits 42 includes a second specific number of (three in the illustrated figure) LED chips 34 that are connected in series. In the LED module 1a, the first specific number (four) is different from the second specific number (three), and the first prescribed number (four) is the same as the second prescribed number (four). That is, in the LED module 1a, the number of LED chips connected in series of each first light source 31 is different from that of each second light source 32. With the above configuration, the LED module 1a can make a difference between a forward voltage of each first light source 31 and a forward voltage of each second light source 32, and also make a difference between light flux of each first light source 31 and light flux of each second light source 32.

In this case, a forward voltage of each first light source 31 is a total voltage of forward voltages of LED chips 34 in each corresponding first segmental circuit 41. Therefore, a forward voltage of each first light source 31 substantially equals the product of a forward voltage of its own each LED chip 34 and the first specific number. A forward voltage of each second light source 32 is a total voltage of forward voltages of LED chips 34 in each corresponding second segmental circuit 42. Therefore, a forward voltage of each second light source 32 substantially equals the product of a forward voltage of its own each LED chip 34 and the second specific number.

Luminous flux of each first light source 31 more increases as the number of its own LED chips 34 more increases. Luminous flux of each first light source 31 substantially equals the product of luminous flux of one LED chip 34 and the number of its own LED chips 34. Luminous flux of each second light source 32 substantially equals the product of luminous flux of one LED chip 34 and the number of its own LED chips 34.

In the embodiment, each of the first and second light sources 31 and 32 is a surface-mount LED (a surface-mount type LED) that is mounted on (the surface 21 of) the circuit substrate 2 by surface mounting (surface mount technology). The LED module 1a can accordingly have a configuration that includes the first and second light sources 31 and 32 mounted on the surface 21 of the circuit substrate 2 without wires. The first and second light sources 31 and 32 mounted means mechanical connection between the circuit substrate 2 and the first and second light sources 31 and 32 on the surface 21 of the circuit substrate 2, and electrical connection between the conductive pattern 23 of the circuit substrate 2 and the first and second light sources 31 and 32.

Each first light source 31 includes a package 311 that houses LED chips 34 (sixteen chips in FIG. 3A) and a wavelength conversion member 35.

Each second light source 32 includes a package 321 that houses LED chips 34 (twelve chips in FIG. 3B) and a wavelength conversion member 35.

Preferably, each first light source 31 has the same size as each second light source 32. It is also preferable that each first light source 31 and each second light source 32 have external connection electrodes with identical arrangement and sizes. The LED module 1a can accordingly have the high flexibility of arrangement for each of the first and second light sources 31 and 32.

Preferably, LED chips 34 in each of the first and second light sources 31 and 32 are arranged around a center to have point symmetry. The center is an intersection of a central axis 350 of a corresponding wavelength conversion member 35 and a plane perpendicular to the central axis 350. That is, LED chips 34 in each of the first and second light sources 31 and 32 are arranged to be point symmetry with respect to the center. It is accordingly possible to suppress irregular color of the LED module 1a. The plane is a plane including corresponding LED chips 34. The irregular color is a phenomenon that chromaticity of the LED module 1a varies according to its light emission direction.

Preferably, LED chips 34 in each of the first and second light sources 31 and 32 include a group of LED chips 34 that are arranged along an outer periphery 351 of a corresponding wavelength conversion member 35 and that each have an identical shortest distance L1 from the outer periphery 351 of the corresponding wavelength conversion member 35. It is accordingly possible to suppress dispersion in chromaticity for each of the first and second light sources 31 and 32 in the LED module 1a. In other words, irregular color of the LED module 1a can be suppressed. In the LED module 1a, the shortest distance L1 of the first light sources 31 may be different from the shortest distance L1 of the second light sources 32.

Figure 4A:
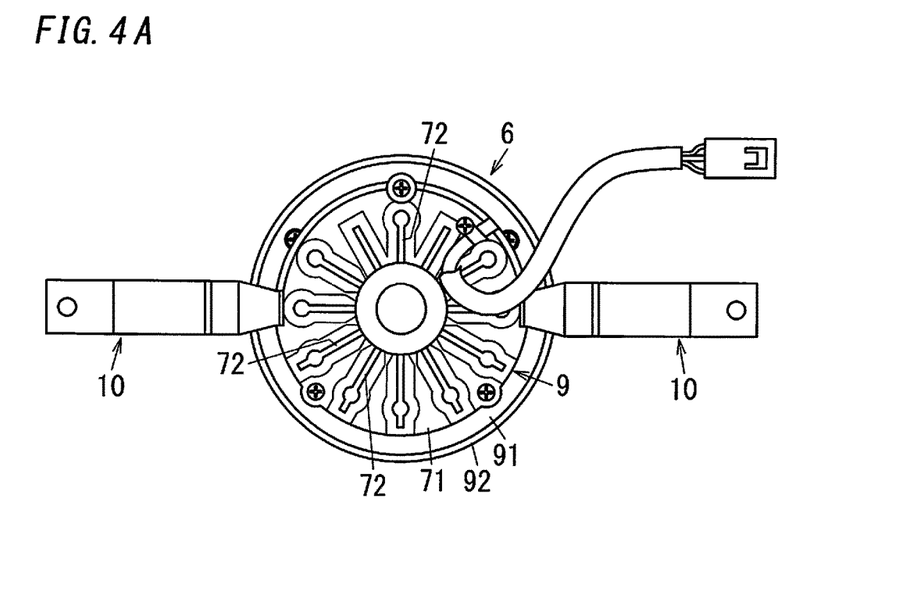
FIG. 4A is a schematic plan view of a light fixture with the LED module.

A light fixture 6 including the above LED module 1a will be hereinafter explained with reference to FIGS. 4A, 4B and 5.

In the embodiment, the light fixture 6 includes the LED module 1a and a fixture body 7 that retains the LED module 1a. The light fixture 6 can accordingly improve a feeling of brightness of a space.

The light fixture 6 is, for example a ceiling recessed light fixture. Specifically, the light fixture 6 is a ceiling recessed downlight.

The light fixture 6 may include a mounting frame 9 attached to a lower end of the fixture body 7, and two mounting springs 10 attached to the mounting frame 9.

In an example, the fixture body 7 is made of aluminum. The fixture body 7 may be made by aluminum die casting.

In the embodiment, the fixture body 7 integrally includes a base 71 and radiation fins 72. The base 71 is shaped like a disc, and has a first surface (a lower side) 711 and a second surface (an upper side) 712. The radiation fins 72 protrudes from the second surface 712 of the base 71 along a thickness direction of the base 71 (upwards). The radiation fins 72 are arranged side by side on the circumference of the base 71. In the light fixture 6, the LED module 1a is disposed on a side of the first surface 711 of the base 71. Preferably, the light fixture 6 is further provided with a heat conductive sheet between the base 71 and the LED module 1a, and the heat conductive sheet is electrically non-conductive and has thermal conductivity. For example, the heat conductive sheet is a silicone gel sheet that is electrically non-conductive and has thermal conductivity. As an example, the silicone gel sheet is SARCON® or the like. Material of the heat conductive sheet is not limited to silicone gel, but may be, for example elastomer or the like that is electrically non-conductive and has thermal conductivity.

Since the light fixture 6 includes the heat conductive sheet between the LED module 1a and the fixture body 7, heat generated by the LED module 1a can be transmitted to the fixture body 7 efficiently. The light fixture 6 can accordingly dissipate heat generated by the LED module 1a through the radiation fins 72 efficiently.

In an example, the mounting frame 9 is made of aluminum. The mounting frame 9 may be made by aluminum die casting. The mounting frame 9 includes a frame body 91 that is shaped like a hollow cylinder, and a flange 92 that protrude outside from a lower end of the frame body 91. The outer periphery of the flange 92 is shaped like a circle. An outer diameter of the flange 92 is larger than that of the frame body 91.

In an example, each mounting spring 10 is made of stainless steel. Each mounting spring 10 is a plate spring. The two mounting springs 10 are farthest apart from each other on the circumference of the frame body 91. In the light fixture 6, the two mounting springs 10 are aligned in a straight line in planar view.

For example, the light fixture 6 is attached to a ceiling member with the mounting frame 9 and the two mounting springs 10. The ceiling member is provided therein with a mounting hole for attaching the light fixture 6 to. An inner diameter of the mounting hole is larger than the outer diameter of the frame body 91 and smaller than the outer diameter of the flange 92. In the installation of the light fixture 6, the mounting springs 10 are first elastically deformed along both sides of the fixture body 7 before the fixture body 7 is inserted into the mounting hole. The fixture body 7 and the mounting springs 10 are then inserted into the mounting hole and the flange 92 comes into contact with a lower surface of the ceiling member. As a result, the mounting springs 10 come into contact with an upper surface of the ceiling member by respective spring force of the mounting springs 10. Thus, the light fixture 6 can hold the ceiling member with and between the mounting springs 10 and the flange 92. In other words, the light fixture 6 is recessed into the ceiling member.

Preferably, the light fixture 6 further includes lenses 8 provided one each for the first and second light sources 31 and 32. That is, each of the lenses 8 is configured to control distribution (distribution of luminous intensity) of light from a corresponding one of the first and second light sources 31 and 32. The light fixture 6 can accordingly increase optical output thereof and make clear differences in light and dark in luminance distribution, thereby further improving the feeling of brightness.

For example, each lens 8 is made from acrylic resin. In the example of FIG. 5, each lens 8 has a form, an outer diameter of which becomes gradually larger towards the far end from the circuit substrate 2 along its own central axis. Each lens 8 also has an outer peripheral surface 80. A form of each lens 8 is axially symmetric around its own central axis. Each lens 8 has a cavity 81 that is on a side of the circuit substrate 2 and houses a corresponding one of the first and second light sources 31 and 32. An inside 811 of the cavity 81 includes a light entrance surface 82. The inside 811 of the cavity 81 is formed of an inner bottom 812 of the cavity 81 and an inner peripheral surface 813 of the cavity 81. The cavity 81 has an opening that is shaped like a circle. A surface 83 of each lens 8 on the opposite side to the circuit substrate 2 forms a light emission surface 84.

In the embodiment, each lens 8 has a function for allowing light from the inner bottom 812 of a corresponding cavity 81 to be emitted from a corresponding light emission surface 84, and a function for allowing light from the inner peripheral surface 813 of the corresponding cavity 81 to be reflected by an corresponding outer peripheral surface 80 to be emitted from the corresponding light exit surface 84. In FIG. 5, dash dot dash lines schematically show transmission paths of respective light from the first light source 31.

Figure 4B:
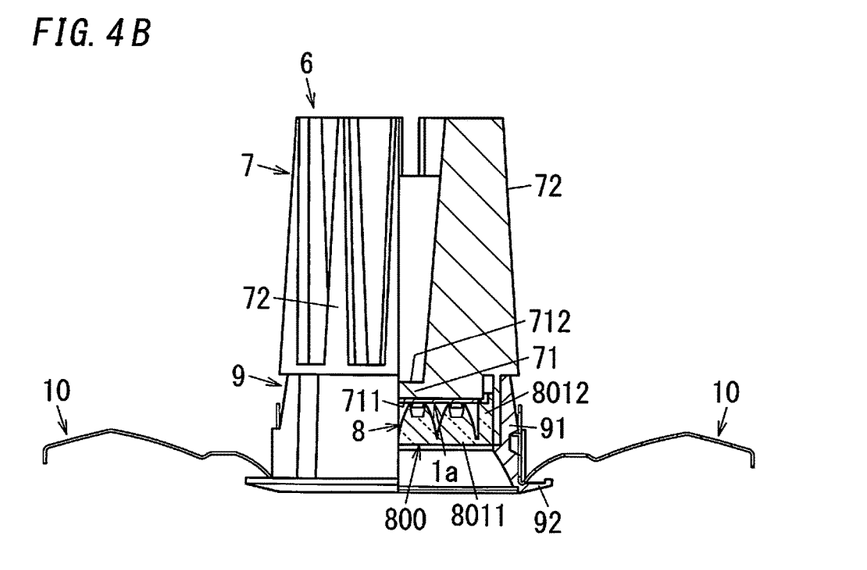
FIG. 4B is a partially broken front view of the light fixture with the LED module.
Figure 5:
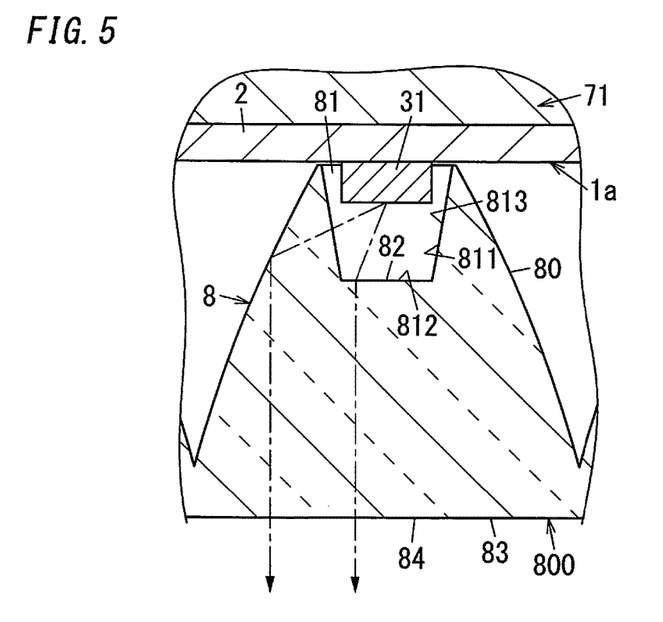
FIG. 5 is a view illustrating part of the light fixture with the LED module.

In the example of FIGS. 4B and 5, the light fixture 6 includes a lens member 800 having the lenses 8. The lens member 800 includes a front plate part 8011 apart from the surface 21 of the circuit substrate 2, and a side plate part 8012 shaped like a circular tube protruding from a periphery of the front plate part 8011 towards the fixture body 7. In short, the lens member 800 is shaped like a cylinder with a lid. The front plate part 8011 and the side plate part 8012 may be made from acrylic resin. In the lens member 800, the front plate part 8011 is integrally formed with the lenses 8. In short, the lens member 800 is made from acrylic resin. The lens member 800 is attached to the fixture body 7. In the light fixture 6, preferably each of the first and second light sources 31 and 32 has an identical central axis along with a corresponding lens 8 stacked in the thickness direction of the circuit substrate 2. Each of the first and second light sources 31 and 32 has the same central axis as that of a corresponding wavelength conversion member 35.

Preferably, each lens 8 has diffusional permeability. The light fixture 6 can accordingly increase the luminance of light from each lens 8, thereby improving the feeling of brightness.

Preferably, a light emission surface 84 of each lens 8 has light diffusible property. For example, the light emission surface 84 having the light diffusible property may be formed by, e.g. emboss processing.

Each lens 8 may be made of transparent material (e.g., acrylic resin) containing light diffusion agent, thereby having the light diffusible property. The light diffusion agent is particulate. Material examples of the light diffusion agent include inorganic material, organic material, organic-inorganic hybrid material and the like. Examples of the inorganic material include aluminum oxide, silica, titanium oxide, gold and the like. As an example, organic material is fluorine-based resin or the like.

MODIFIED EXAMPLE 1

Figure 6:
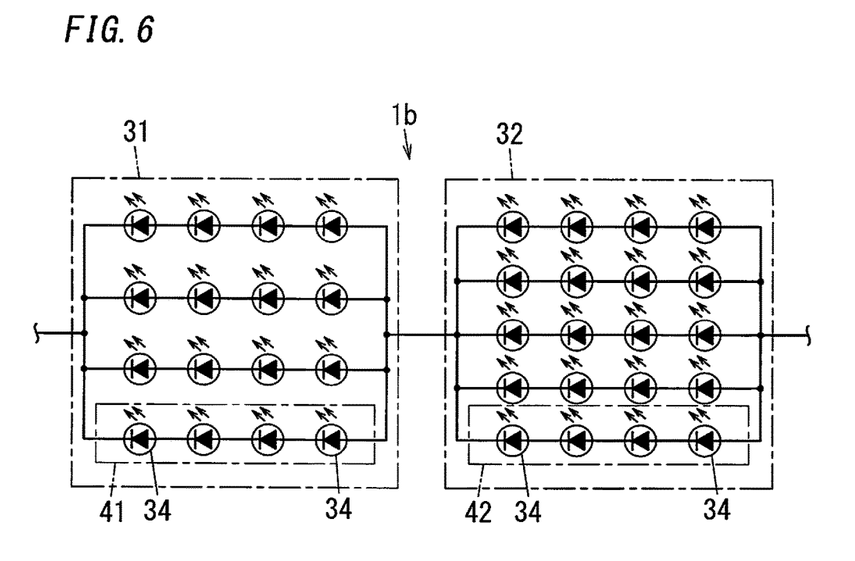
FIG. 6 is a circuit diagram of an LED module as first modified example in Embodiment 1.

An LED module 1b in Modified Example 1 of Embodiment 1 will be hereinafter explained with reference to FIG. 6.

The LED module 1b in Modified Example 1 has the same basic configuration as that of the LED module 1a in Embodiment 1. Each first light source 31 of the LED module 1b in Modified Example 1 has the same circuit configuration as that of each first light source 31 of the LED module 1a in Embodiment 1. Each second light source 32 of the LED module 1b in Modified Example 1 has a circuit configuration different from that of each second light source 32 of the LED module 1a. LED chips 34 (sixteen chips in the illustrated figure) of each first light source 31 in the LED module 1b of Modified Example 1 form a first prescribed number of (four in the illustrated figure) first segmental circuits 41 that are connected in parallel. Each first segmental circuit 41 includes a first specific number of (four in the illustrated figure) LED chips 34 that are connected in series. LED chips 34 (twenty chips in the illustrated figure) of each second light source 32 in the LED module 1b of Modified Example 1 form a second prescribed number of (five in the illustrated figure) second segmental circuits 42 that are connected in parallel. Each second segmental circuit 42 includes a second specific number of (four in the illustrated figure) LED chips 34 that are connected in series. In the LED module 1b, the first specific number (four) is the same as the second specific number (four). In the LED module 1b, the first prescribed number (four) is different from the second prescribed number (five). That is, in the LED module 1b, each first light source 31 is different in number of circuits connected in parallel from each second light source 32. In the above configuration, although a forward voltage of each first light source 31 substantially equals a forward voltage of each second light source 32, the LED module 1b in Modified Example 1 can make a difference between luminous flux of each first light source 31 and luminous flux of each second light source 32.

It is possible to improve the feeling of brightness even in the case where the LED module 1a of the light fixture 6 in Embodiment 1 is replaced with the LED module 1b in Modified Example 1.

MODIFIED EXAMPLE 2

Figure 7:
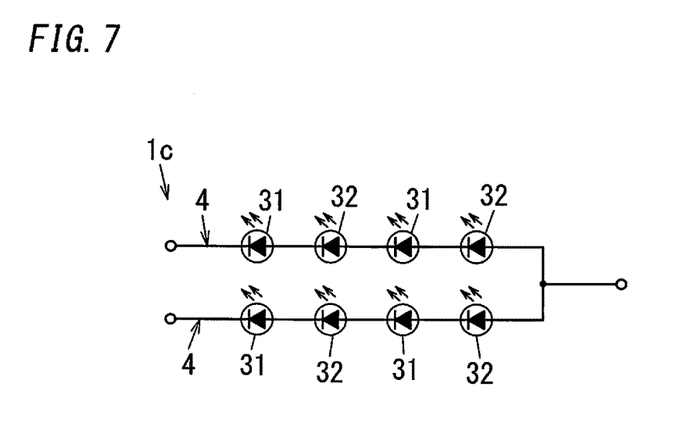
FIG. 7 is a schematic circuit diagram of an LED module as second modified example in Embodiment 1.

An LED module 1c in Modified Example 2 of Embodiment 1 will be hereinafter explained with reference to FIG. 7.

The LED module 1c in Modified Example 2 has the same basic configuration as that of the LED module 1a in Embodiment 1. The LED module 1c in Modified Example 2 differs from the LED module 1a in Embodiment 1 in that the LED module 1c includes two series circuits 4 that are connected in parallel, where each of the series circuits 4 includes: first light sources 31, the number of which is half of that of the first light sources 31 in the series circuit 4 of the LED module 1a; and second light sources 32, the number of which is half of that of the second light sources 32 in the series circuit 4 of the LED module 1a.

It is possible to improve the feeling of brightness even in the case where the LED module 1a of the light fixture 6 in Embodiment 1 is replaced with the LED module 1c in Modified Example 2.

(Embodiment 2)

Figure 8:
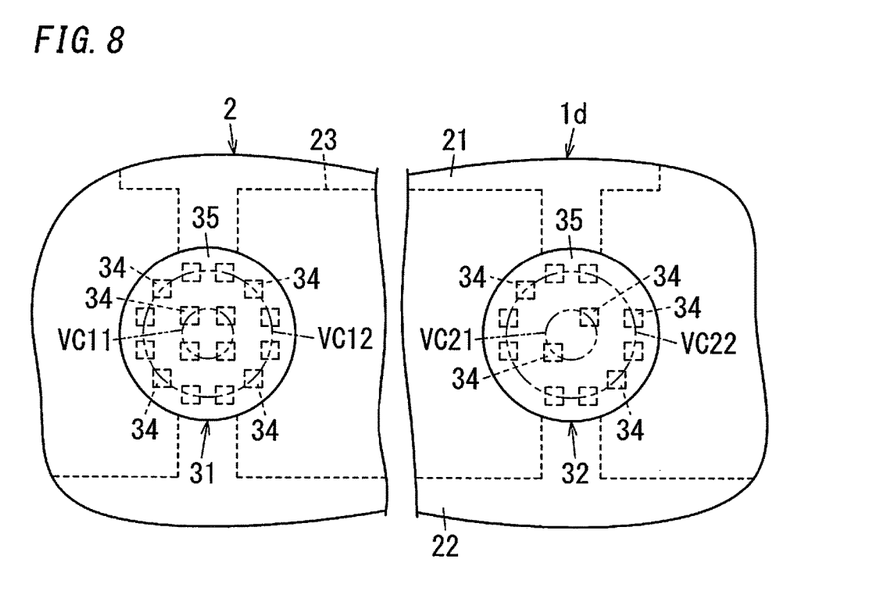
FIG. 8 is an enlarged plan view of part of an LED module in accordance with Embodiment 2.

An LED module 1d in Embodiment 2 will be hereinafter explained with reference to FIG. 8.

The LED module 1d in the present embodiment has the same basic configuration as that of the LED module 1a in Embodiment 1. In the LED module 1d of the embodiment, LED chips 34 of each of first and second light sources 31 and 32 are mounted on a surface 21 of a circuit substrate 2. The LED module 1d of the embodiment can accordingly increase the optical output thereof. In the LED module 1d of the embodiment, identical constituent elements to those of the LED module 1a have been allocated identical reference numerals, and description thereof has been omitted as appropriate.

The LED chips 34 mounted on the surface 21 of the circuit substrate 2 means mechanical connection between the circuit substrate 2 and the LED chips 34 on the surface 21 of the circuit substrate 2, and electrical connection between a conductive pattern 23 of the circuit substrate 2 and the LED chips 34. In short, the LED module 1d of the embodiment is a COB (Chip On Board) LED module.

Each first light source 31 of the LED module 1d in the embodiment includes a wavelength conversion member 35 that is shaped like a circle in planar view. In each first light source 31, LED chips 34 (sixteen chips in the illustrated figure) are separately arranged on two or more (two in the illustrated figure) concentric circles VC11 and VC12. Specifically, in each first light source 31, four LED chips 34 are arranged at regular intervals on an inner circle VC11 of the two concentric circles VC11 and VC12. In addition, twelve LED chips 34 are arranged at regular intervals on an outer circle VC12 of the two concentric circles VC11 and VC12.

Each second light source 32 of the LED module 1d in the embodiment includes a wavelength conversion member 35 that is shaped like a circle in planar view. In each second light source 32, LED chips 34 (twelve chips in the illustrated figure) are separately arranged on two or more (two in the illustrated figure) concentric circles VC21 and VC22. Specifically, in each second light source 32, two LED chips 34 are arranged at regular intervals on an inner circle VC21 of the two concentric circles VC21 and VC22. In addition, ten LED chips 34 are arranged at regular intervals on an outer circle VC22 of the two concentric circles VC11 and VC12.

In the LED module 1d of the embodiment, each wavelength conversion member 35 of the first and second light sources 31 and 32 is shaped like a circle in planar view. It is accordingly possible to further suppress irregular color of respective light from the first and second light sources 31 and 32. In the LED module 1d of the embodiment, it is possible to make luminous intensity distribution characteristics of each of the first and second light sources 31 and 32 approach those of a point light source.

It is possible to improve the feeling of brightness even in the case where the LED module 1a of the light fixture 6 in Embodiment 1 is replaced with the LED module 1d in the present embodiment.

Respective material, numerical values and the like in Embodiment 1, Modified Example 1, Modified Example 2 and Embodiment 2 are just preferable examples, and not intended to be limited thereto. It is intended by the following claims to claim any and all modifications and variations that fall within the true scope of the present teachings.

The circuit substrate 2 is not limited to the circular shape in planar view, but may be shaped like, e.g. a rectangle or the like in planar view. The printed-circuit board forming the circuit substrate 2 may also be, e.g. a metal-based printed circuit board.

The circuit substrate 2 may also be provided in a center part thereof with a wire through-hole for allowing first and second electric wires to pass through. The first electric wire is electrically connected with the first terminal 27 and the second electric wire is electrically connected with the second terminal 28.

Optically-transparent material of each wavelength conversion member 35 is not limited to silicone resin, but may be, for example glass or the like.

Material of each lens 8 is not limited to acrylic resin, but may be, for example polycarbonate resin, silicone resin, glass or the like.

Each of the LED modules 1a to 1d may include the lens member 800. It is accordingly possible to further improve the feeling of brightness.

The light fixture 6 may further include a cover that covers the lenses 8. The cover has optically-transparency, for example. In this case, at least part of an optical system including the lenses 8 and the cover may have diffusional permeability.

The light fixture is not limited to the downlight, but may be a light fixture such as, for example a projector for a large-scale facility (an amusement facility or the like).

The invention claimed is:

1. A light-emitting diode (LED) module, comprising
a circuit substrate; and
light sources that are disposed on a surface of the circuit substrate and each of which includes LED chips and a wavelength conversion member covering the LED chips, the light sources comprising first light sources and second light sources, wherein:
LED chips in each of the first light sources differ in number from LED chips in each of the second light sources, and
the circuit substrate comprises a conductive pattern that is connected with the first and second light sources, the conductive pattern forming each of one or more series circuits along with at least one of the first light sources and at least one of the second light sources.

2. The LED module of claim 1, wherein LED chips in each of the first and second light sources are arranged to be point symmetry with respect to a center, the center being an intersection of a central axis of a corresponding wavelength conversion member and a plane perpendicular to the central axis.

3. The LED module of claim 2, wherein LED chips in each of the first and second light sources include a group of LED chips that are arranged along an outer periphery of a corresponding wavelength conversion member and that each have an identical shortest distance from the outer periphery of the corresponding wavelength conversion member.

4. The LED module of claim 1, wherein each of the first and second light sources is a surface-mount LED.

5. The LED module of claim 1, wherein LED chips in each of the first and second light sources are mounted on the surface of the circuit substrate.

6. The LED module of claim 1, wherein:
the LED chips in each of the first light sources form a first prescribed number of first segmental circuits that are connected in parallel, each of the first segmental circuits comprising a first specific number of LED chips that are connected in series,
the LED chips in each of the second light sources form a second prescribed number of second segmental circuits that are connected in parallel, each of the second segmental circuits comprising a second specific number of LED chips that are connected in series,
the first specific number is different from the second specific number, and
the first prescribed number is the same as the second prescribed number.

7. The LED module of claim 1, wherein:
the LED chips in each of the first light sources form a first prescribed number of first segmental circuits that are connected in parallel, each of the first segmental circuits comprising a first specific number of LED chips that are connected in series,
the LED chips in each of the second light sources form a second prescribed number of second segmental circuits that are connected in parallel, each of the second segmental circuits comprising a second specific number of LED chips that are connected in series,
the first specific number is the same as the second specific number, and
the first prescribed number is different from the second prescribed number.

8. A light fixture, comprising:
the LED module of claim 1; and
a fixture body that retains the LED module.

9. The light fixture of claim 8, further comprising lenses provided one each for the first and second light sources.

10. The light fixture of claim 9, wherein each of the lenses has diffusional permeability.

11. The LED module of claim 1, wherein:
each of the first light sources includes a first package that houses the LED chips,
each of the second light sources includes a second package that houses the LED chips, and
the first package and second package are independently provided from each other.

12. The LED module of claim 1, wherein:
the LED chips in each of the first light sources form a first prescribed number of first segmental circuits that are connected in parallel, each of the first segmental circuits comprising a first specific number of LED chips that are connected in series, and
the LED chips in each of the second light sources form a second prescribed number of second segmental circuits that are connected in parallel, each of the second segmental circuits comprising a second specific number of LED chips that are connected in series.

13. The LED module of claim 1, wherein the LED chips in each of the first light sources are arranged in a matrix.

14. The LED module of claim 1, wherein the LED chips in each of the second light sources are arranged in a matrix.

15. The LED module of claim 1, wherein the LED chips in each of the first light sources are arranged on a circle.

16. The LED module of claim 1, wherein the LED chips in each of the first light sources are arranged on concentric circles.

17. The LED module of claim 1, wherein the LED chips in each of the second light sources are arranged on a circle.

18. The LED module of claim 1, wherein the LED chips in each of the second light sources are arranged on concentric circles.

* * * * *